(12) United States Patent
Yoshida

(10) Patent No.: US 6,451,633 B1
(45) Date of Patent: Sep. 17, 2002

(54) METHOD FOR MANUFACTURING SEMICONDUCTOR INTEGRATED CIRCUIT

(75) Inventor: Yoshifumi Yoshida, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/444,432

(22) Filed: Nov. 19, 1999

(30) Foreign Application Priority Data

Nov. 20, 1998 (JP) .............................. 10-331690
Nov. 19, 1999 (JP) .............................. 11-328986

(51) Int. Cl.[7] .............................................. H01L 21/84
(52) U.S. Cl. ........................................ 438/151; 438/149
(58) Field of Search ............................... 438/149, 151, 438/622

(56) References Cited

U.S. PATENT DOCUMENTS

| | | | | |
|---|---|---|---|---|
| 4,734,383 A | * | 3/1988 | Ikeda | 438/233 |
| 5,576,243 A | * | 11/1996 | Wuu | 438/154 |
| 5,837,602 A | * | 11/1998 | Lee | 438/621 |
| 5,960,266 A | * | 9/1999 | Ishii | 438/161 |
| 6,222,267 B1 | * | 4/2001 | Omura | 257/741 |
| 6,232,155 B1 | * | 5/2001 | Lee | 438/149 |
| 6,232,220 B1 | * | 5/2001 | Penka | 438/637 |

* cited by examiner

Primary Examiner—John F. Niebling
Assistant Examiner—Stacy Whitmore
(74) Attorney, Agent, or Firm—Adams & Wilks

(57) ABSTRACT

A semiconductor integrated circuit is manufactured by forming an insulation film on a semiconductor substrate, forming an SOI film on the insulation film, forming an oxide film on the SOI film, and forming a contact hole penetrating through the oxide film, the SOI film and the insulation film and extending partially into the semiconductor substrate. LOCOS oxide regions are formed over the semiconductor substrate. A gate oxide film is formed on side and bottom surfaces of the contact hole and over regions of the semiconductor substrate except for the LOCOS oxide regions. A gate electrode is formed on the gate oxide film. The gate oxide film is removed from part of the side surface and part of the bottom surface of the contact hole. A metal interconnection is formed to electrically connect the SOI film with the semiconductor substrate.

8 Claims, 11 Drawing Sheets

PRIOR ART

PRIOR ART

PRIOR ART

METHOD FOR MANUFACTURING SEMICONDUCTOR INTEGRATED CIRCUIT

BACKGROUND OF THE INVENTION

1. Field of the Invention

This invention relates generally to a semiconductor integrated circuit formed on an SOI substrate and, more particularly, to a semiconductor integrated circuit having a static electricity protection transistor formed on an SOI film over a substrate, and to a method for manufacturing the same.

2. Background Information

There is shown in FIG. 7 a conventional static electricity protection transistor formed on a substrate having an SOI film. Meanwhile, FIG. 8 shows a connection diagram thereof. FIG. 7A is a plan view as viewed from above FIG. 7B a sectional view taken on line (a—a) in a gate width direction, and FIG. 7C a sectional view taken on line (b—b) in a gate lengthwise direction. The conventional static electricity protection transistor is structured by a gate electrode 43, a gate oxide film 40, a channel region 57, a source region 41, a drain region 42, a ground region 56, an interconnect contact, metal interconnections 58, 59, 60, and an interlayer insulation film 46. As shown in the figure, the gate oxide film 40 is formed on the SOI film as a channel region. The gate electrode 43 is formed of polysilicon on the channel region 57, on which the interlayer insulation film 46 is formed. Here, the static electricity protection transistor basically uses an N-type MOS transistor and hence the channel region SOI film is in a P-type. In some cases, a P-type transistor is employed. On an SOI wafer with a thin SOI film thickness, the source region 41, drain region 42 and ground region 56 in depth direction reach the insulation film 2 on the substrate 1. LOCOS 45 is formed in areas other than the channel region 57, source region 41, drain region 42 and ground region 56. The LOCOS 45 reaches the insulation film 2 over the substrate 1. Consequently, this LOCOS 45 completely separates the channel region 57, source region 41, drain region 42 and ground region 56 from the channel region, source region, drain region and ground region of another transistor.

As shown in FIG. 8, in the conventional static electricity protection transistor a pad 47 is connected to the drain region 42 of the static electricity protection transistor. The drain 42 is in turn connected to a semiconductor integrated circuit (semiconductor circuit). The source region of the static electricity protection transistor is connected to a ground terminal of the semiconductor integrated circuit. Here, for a static electricity protection transistor formed on an SOI film over a substrate through an insulation film, a gate electrode 43 is connected to a ground terminal through a resistance 48. Also, if a static electricity protection transistor is formed on an SOI film in a same layout as that of a static electricity protection transistor formed on a bulk wafer, a gate electrode 43 will be in floating. The source region 41 is connected to the ground region 56 and ground terminal. Here, the ground region 56 formed on the SOI wafer is not electrically connected to the channel region 57 and substrate 1, differently from a transistor formed on a bulk wafer. Consequently, the channel region 57 is floating in potential.

Furthermore, a method for manufacturing a conventional static electricity protection transistor is explained with reference to FIGS. 9(A)–9(E), 10(A)–10(E) and 11(A)–11(C). An SOI film 19 is formed over a substrate 1 through an insulation film 2 (FIG. 9A). An oxide film 50 is formed on the SOI film 19 (FIG. 9B). Next, the oxide film 50 is patterned to form openings 51 for alignment marks (FIG. 9C). This is placed in a thermal oxidation furnace to form a thermal oxide film 52 (FIG. 9D). At this time, the SOI film silicon positioned at the openings 51 of the oxide film 50 is oxidized greater than the SOI film silicon having the oxide film 50. Consequently, a thermal oxide film 52 at the opening 51 is greater in thickness than other portions. If the thermal oxide film 52 is removed, recess steps are formed as shown in FIG. 9E which are alignment marks 53. Then, an oxide film 54 and nitride film 55 for LOCOS are formed and patterned (FIG. 10A). After patterning the nitride film 55, LOCOS 45 is formed in an oxide furnace as shown in FIG. 10B.

Next, the nitride film 55 and the oxide film 54 in areas other than the LOCOS 45 are removed, and thereafter a gate oxide film 40 is formed (FIG. 10C). Furthermore, the polysilicon film is formed and patterned to form a gate electrode 43 (FIG. 10D). Then, as shown in FIG. 10E, N-type ions are implanted to the source/drain region 41, 42. Further, as shown in FIG. 11A, P-type ions are implanted to a ground region 56. Next, as shown in FIG. 11B an interlayer insulation film 46 is formed. Thereafter, contact holes are formed and then the interlayer insulation film 46 is planarized by a reflow process, followed by forming metal interconnections 58, 59, 60 as shown in FIG. 11C. A static electricity protection transistor thus formed is connected as shown in FIG. 8.

In the conventional static electricity protection transistor constructed as above, when static electricity enters the pad, surface breakdown occurs between the drain and the substrate to flow charges toward the substrate being in a ground level. The flowing charges to the substrate raises a potential on the substrate to thereby induce bipolar operation between the drain region, the channel region and the source region. Thus, current flows through a path of the drain, the substrate and the source.

In the static electricity protection transistor formed on a bulk wafer, a substrate contact is provided around the static electricity protection transistor, thereby bringing a substrate potential to a ground level. However, a transistor is formed on an SOI wafer having a small semiconductor film thickness on an insulation film thereof by the conventional CMOS forming method, and the SOI film in a depth direction will be entirely formed as a source/drain region. Consequently, even if a substrate contact is provided around the transistor as in the conventional transistor, the potential of the channel region (or substrate potential) is in a floating condition. Due to this, the charge flowing to the channel region of the static electricity protection transistor due to surface breakdown has nowhere to exit, resulting in an abrupt increase in the channel region potential. Bipolar operation, if induced herein, is satisfactory. However, if a large amount of chargers [more in amount] enter the channel region, there arises a problem that electrostatic breakdown or Joule thermal breakdown possibly occurs because that region is very small in size and hence low in capacitance for accepting charges.

Meanwhile, where bipolar operation occurs through the drain region, channel region and source region, the static electricity protection transistor formed on a bulk wafer has a source connected to a substrate ground region so that the charges entered the source region can be released toward the substrate. However, in the static electricity protection transistor formed on an SOI wafer having an small SOI film thickness on an insulation film, a source region is directly connected to a ground terminal of a semiconductor integrated circuit. Accordingly, the charges entered the source region have nowhere to escape so that there is a possibility that they flow to other transistors connected to the ground line and induce electrostatic breakdown.

Furthermore, where bipolar operation occurs through the drain region, channel region and source region to flow large current through the transistor, large heat generation occurs on the transistor. In the conventional transistor formed on a bulk transistor, because the transistor at its lower side is connected with a substrate, heat dissipates through the substrate. On the SOI wafer, however, the transistor at its lower side is covered by an oxide film that is poor in thermal conductivity. Consequently, the amount of heat generated upon flowing current through the transistor is greater than that in the transistor formed on a bulk wafer, resulting in a problem of inducing thermal breakdown.

Meanwhile, there is also a problem on a way to ground the gate of the static electricity protection transistor. The gate electrode of the static electricity protection transistor on a bulk wafer is grounded to the substrate through a resistance. This is because, if the gate be connected directly to a ground line, the charges released onto the ground line enter the gate of the static electricity protection transistor thereby causing gate breakdown. However, if a static electricity protection transistor is formed on an SOI wafer to a same layout as that of a bulk wafer, its gate electrode is in a floating state. If in this state static electricity or the like enters the pad, no surface breakdown occurs because of unstable gate potential so that current flows due to punch-through. However, because there is limitation in amount of current to flow due to punch-through, it is impossible to completely release the static electricity entered the pad. Thus, there has been a problem that it results in breakdown in an internal circuit.

SUMMARY OF THE INVENTION

In order to solve the above problems, in a semiconductor integrated circuit having a static electricity protection transistor according to the present invention, the static electricity protection transistor comprises: a source region; a drain region; a channel region; a gate electrode provided on the channel region through a gate oxide film; a substrate contact formed penetrating through the SOI film and reaching part of the substrate; a substrate connection region contact connecting between the channel region and the substrate contact; and an interconnection provided to the substrate contact and the substrate connection region contact and electrically connecting between the channel region and the substrate. With this structure, the charges flowing into the channel region of the static electricity protection transistor are allowed to flow through the substrate contact onto the substrate. Thus, prevention is made against electrostatic breakdown or Joule thermal breakdown.

Further, at least one is further comprised of a low resistance connection region formed in a surface of the substrate in a position provided with the substrate contact and having a resistance lower than that of the substrate and a low resistance connection region formed in the SOI film in a position provided with the substrate connection region contact and having a resistance lower than that of the SOI film. This makes the connection between the channel region and the substrate lower in resistance with positiveness.

Further, the substrate connection region contact is arranged surrounding the substrate contact and including the substrate contact.

Further, a contact region formed from an SOI film the same as in the channel region is provided, a gate oxide film is formed on the contact region, and a gate electrode is formed only on a part of the gate oxide film. That is, in the connection region there exist a portion formed with the gate electrode through the gate oxide film and a portion not formed with it. With this structure, it is possible to prevent the connection region from being implanted with an ion species for the source/drain region during an ion implant process for forming a source/drain region.

Also, a static electricity protection transistor comprising: a source region; a drain region; a channel region; a gate electrode provided on the channel region through a gate oxide film; an interlayer insulation film provided on the gate electrode; an interconnect contact hole provided on the source region and penetrating through the interlayer insulation film and the gate oxide film; a substrate contact penetrating through the interlayer insulation film and the SOI film and reaching part of the substrate; and an interconnection provided to the interconnect contact hole and the substrate contact and electrically connecting between the source region and the substrate. With this structure, the charges entered the source region are released onto the substrate through the substrate contact. This eliminates the possibility that the charges flow to other transistors connected to a ground line thereby inducing electrostatic breakdown.

Also, a method for manufacturing a semiconductor integrated circuit comprises: a step of forming an oxide film on an SOI film over a substrate; a step of forming a contact hole penetrating through the oxide film and the SOI film and reaching part of the substrate; a step of forming a LOCOS; a step of forming a gate oxide film; a step of forming a gate electrode; a step of removing the gate oxide film from part of a side surface and part of a bottom surface of the contact hole; and a step of forming a metal interconnection to electrically connect between the SOI film and the substrate.

Also, a method comprises: a first step of forming an oxide film on an SOI film over a substrate; a second step of forming a contact hole penetrating through the oxide film and the SOI film and reaching part of the substrate; a third step of forming a LOCOS; a fourth step of forming a gate oxide film in other areas than the LOCOS; a fifth step of forming a gate electrode on the gate oxide film; a sixth step of decreasing resistance of the SOI film and the substrate in a portion around the contact hole to form a first low resistance connection region and a second low resistance connection region; a seventh step of removing the gate oxide film from part of a side surface and part of a bottom surface of the contact hole to expose the first low resistance connection region and the second low resistance connection region; and an eighth step of electrically connecting between the first low resistance connection region and the second low resistance connection region.

Here, an insulation film may be provided on the substrate and an SOI film be provided thereon. Also, in the second step an alignment hole is simultaneously formed penetrating through the oxide film and SOI film and reaching part of the substrate. In the third step LOCOS is formed reaching the insulation film by exposure with reference to the alignment hole. In the sixth step ion implantation is made to the SOI film and substrate in positions around the contact hole to reduce the respective portions, forming a first low resistance connection region and a second low resistance connection region. Furthermore, after the sixth step, an interlayer insulation film is formed. In the seventh step the gate oxide film is removed from part of a side surface and part of a bottom surface of the contact hole to expose the first low resistance connection region and the second low resistance connection region.

BRIEF DESCRIPTION OF THE DRAWINGS

FIGS. 11A–11D are a process flow (3) showing the method for manufacturing a conventional static electricity protection transistor.

DETAILED DESCRIPTION OF THE PREFERRED EMBODIMENT

Figure 1A:
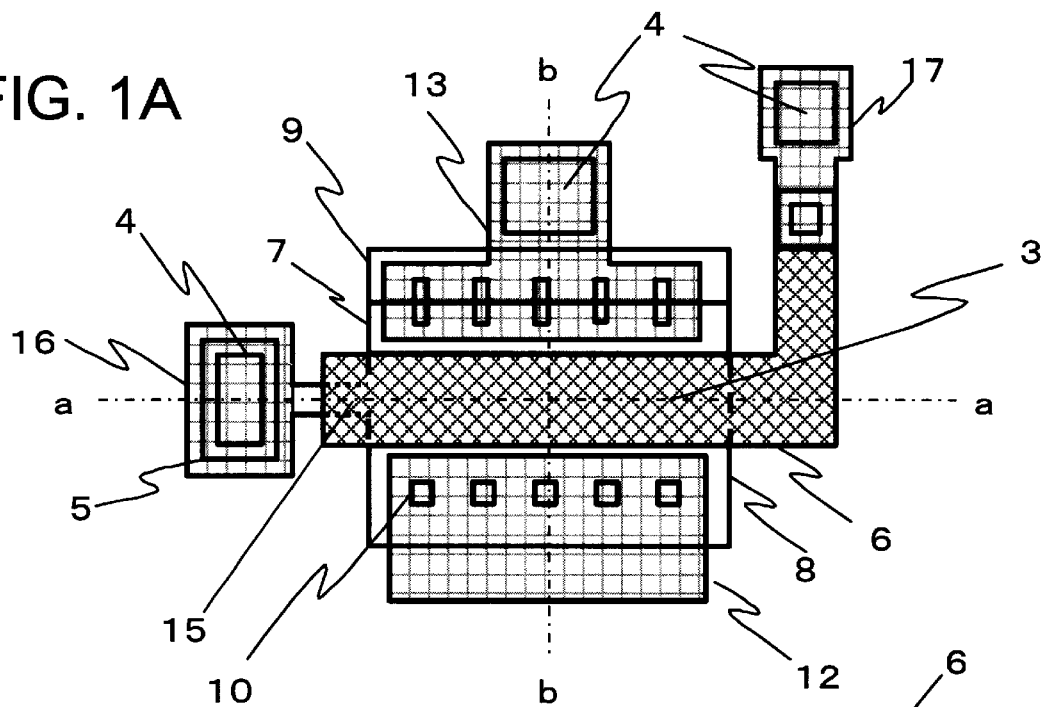
FIG. 1A is a plan view showing a structure of a static electricity protection transistor according to the present invention.

In the present invention, a static electricity protection transistor formed on an SOI film over a substrate through an insulation film has a gate electrode, source and drain regions and a substrate contact. The substrate contact penetrates through an SOI film and on-substrate insulation film and is connected to the substrate. Further, a substrate connection region contact connects between the channel region of the static electricity protection transistor and the substrate contact. Due to this, the charges flowing to the channel region of the static electricity protection transistor due to entrance of static electricity to the pad and surface breakdown flow onto the substrate through the substrate contact, thereby inducing bipolar operation through the drain region, the channel region and the source region. Even where a number of charges flow to the channel region, there is no possibility of causing electrostatic breakdown or Joule thermal breakdown because the region of receiving the charges is not only in the channel region but connected to the substrate.

Also in the invention, connection is provided between the source region of the static electricity protection transistor and the substrate contact. This releases the charges entered the source region due to bipolar operation through the drain region, the channel region and the source region onto the substrate through the substrate contact. Accordingly, there is no possibility that the charges flow to other transistor connected to the ground line and cause electrostatic breakdown.

Furthermore, in the invention, connection is made between the gate electrode of the static electricity protection transistor and the substrate contact. This brings the gate potential to a same potential as on the substrate, and eliminates the problem that no surface breakdown occur due to unstable gate potential. Thus, the static electricity entered the pad causes surface breakdown to thereby induce bipolar operation through the drain region, the channel region and the source region, releasing the charges to the source region.

Also, a manufacturing method of the invention comprises a step of forming an oxide film on an SOI film over a substrate, a step of performing etching penetrating through the oxide film, SOI film and on-substrate insulation film and reaching part of the substrate, a step of forming a LOCOS, a step of forming a gate oxide film, a step of forming a gate electrode, a step of ion implanting for forming a source region, drain region and connection region and for decreasing resistance of the substrate contact and substrate connection region contact, a step of forming an interlayer insulation film, a step of forming a substrate contact and substrate connection region contact, and forming a metal interconnection. Due to this, a substrate contact hole can be formed in the step of forming an alignment mark on the SOI wafer substrate, contributing to reduction in the number of processes. Although conventionally a step is formed in order to form an alignment mark in the oxidation and etching processes, an alignment mark can be formed in the step of forming a substrate contact, thus suppressing the increase in the number of processes. Furthermore, where an SOI film provided on the substrate through an insulation film is small in thickness, it is impossible to utilize a number of oxide film forming processes. Accordingly, it is impossible to conduct an oxidation process for forming an alignment mark or increase the thickness of an oxide film thickness to increase the step dimension. In the manufacturing method of the invention, however, a recess is formed by etching and used as an alignment mark. It is therefore possible to solve the problem that an alignment cannot be formed or the problem that the step in an alignment mark is to small to confirm the alignment mark.

Embodiments

Figure 1B:
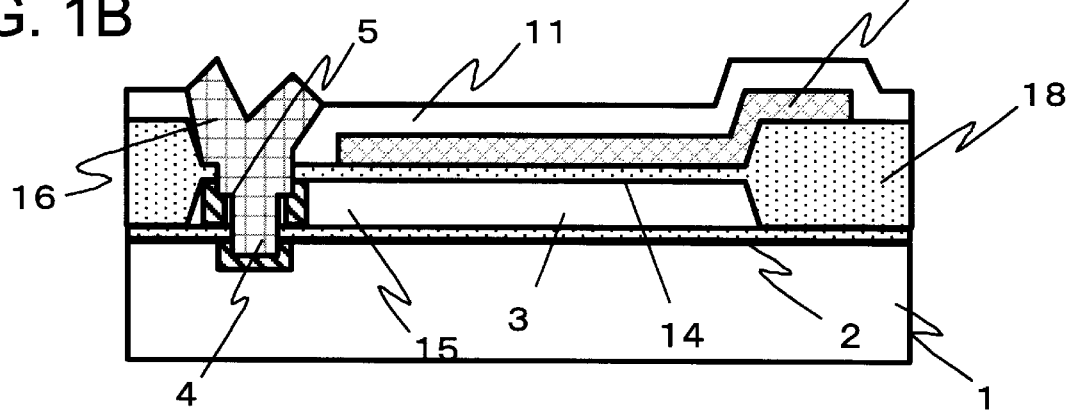
FIG. 1B is a sectional view showing a structure taken on line a—a in FIG. 1A.
Figure 1C:
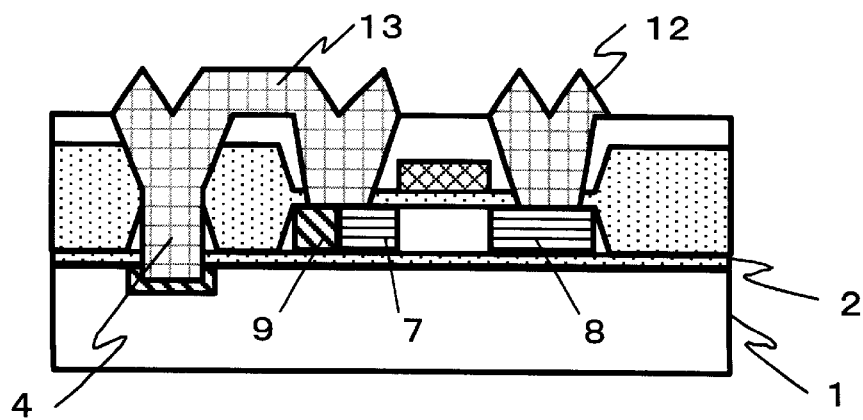
FIG. 1C is a sectional view showing a structure taken on line b—b in FIG. 1A.

Referring first to FIG. 1, an embodiment of the present invention will be described. FIG. 1A shows a plan view of a static electricity protection transistor of the invention as viewed from above. FIG. 1B shows a sectional view of the static electricity protection transistor of the invention taken on line (a—a) in a gate width direction, while FIG. 1C shows a sectional view of the static electricity protection transistor of the invention taken on line (b—b) in a gate length direction. A static electricity protection transistor of the present embodiment includes a gate electrode 6, a gate oxide film 14, a channel region 3, a source region 7, a drain region 8, a ground region 9, connection region 15, a substrate contact 4, a substrate connection region contact 5, interconnect contacts 10, metal interconnections 12, 13, 16, 17, and an interlayer insulation film 11. The gate oxide film 14 is formed on an SOI film formed by the channel region 3 and connection region 15. The gate electrode 6 is formed of polysilicon on the channel region 3 and on part of the connection region 15, on which the interlayer insulation film 11 is formed. Here, because the static electricity protection transistor basically uses an N-type MOS transistor, the semiconductor film of the channel region 3 and connection region 15 is in a P-type. Although a P-type transistor be used as the case may be, explanation is herein made on the N-type transistor. As shown in the FIG. 1A plan view, the source region 7 and the drain region 8 are provided on respective sides of the gate electrode 6, which are formed by ion-implanting to the N-type. The ground region 9 is formed by ion-implanting to the P-type. On an SOI wafer having an SOI layer with a thin film thickness, the source region 7, drain region 8 and ground region 9 have a depth reaching the insulation film 2 over the substrate 1. The drain region 8 is connected to the metal interconnection 12 through the interconnect contact 10 penetrating the interlayer insulation film 11 and gate oxide film 14. Also, the source region 7 and ground region 9 are connected to the metal interconnection 13 through the interconnect contact penetrating through the interlayer insulation film 11 and the gate oxide film 14 and formed on both the source region 7 and the ground region 9. A LOCOS 18 is formed in areas other than the channel region 3, source region 7, drain region 8, ground region 9, connection region 15, substrate contact 4 and substrate connection region contact 5. The LOCOS 18 reaches the insulation film 2 on the substrate 1. Due to this, the LOCOS 18 provides complete isolation for the channel region 3, source region 7, drain region 8, connection region 15 from other transistors' channel region, source region, drain region, ground region and connection region.

Here, the static electricity protection transistor is provided with the connection region 15 (active region) extending from a part of the channel region 3 toward a width direction of the gate electrode 6. This connection region 15 is formed by an SOI film. Over the connection region 15, the gate oxide film 14 is formed over which the gate electrode 6 is further formed in a manner overlapping with part of the connection region 15. The overlap of the gate electrode 6 is to prevent an ion species for the source/drain region from being implanted into the connection region 15 during conducting an ion implant process upon forming the source region 7 and drain region 8. The connection region 15 has one end connected to the substrate connection region contact 5 and substrate contact 4. The substrate contact 4 is a hole opened down to a part of the substrate 1 through the interlayer insulation film 11, gate oxide film 14, connection region 15 and insulation film 2 over the substrate. Meanwhile, the substrate connection region contact 5 is greater than the substrate contact 4 and formed in a form surrounding the substrate contact 4. The substrate connection region contact 5 is a hole opened down to a part of the connection region 15 through the interlayer insulation film 11 and gate oxide film 14. Consequently, the substrate contact 4 and substrate connection region contact 5 have, in section, a contact hole with one step as shown in FIG. 1B. The metal interconnection 16 is buried in the contact hole so that electrical connection can be provided for the channel region 3, connection region 15, substrate connection region contact 5, metal interconnection 16, substrate contact 4 and substrate 1. Thus, positive connection is given between the channel region 3 and the substrate 1. Although this structure is analogous to a layout of partially-depleted type transistor, the invention has a feature that the channel region 3 is connected to the substrate 1.

Here, the connections between the substrate 1 and the metal interconnection 16 and between the connection region 15 and the metal interconnection 16, if directly contacted, will be excessively high in contact resistance. Accordingly, the contact resistance is reduced by conducting ion implantation into an area of the connection region 15 and substrate 1 contacting the metal interconnection 16 by using a high concentration of a same ion species as the connection region 15 and substrate 1.

Furthermore, the present embodiment shows a structure characterized in a way of grounding to the source region 7, ground region 9 and gate electrode 6. As shown in FIG. 1C, the substrate contact 4 is formed sandwiched by the LOCOS 18 in a region close to the ground region 9, thereby providing connection between the metal interconnection 13 connected to the source region 7 and ground region 9 and the substrate contact 4. This provides electrical connection for the source region 7 and ground region 9 to the substrate 1. Also, connection is made for the gate electrode 6 through a substrate contact 4 and metal interconnection 17 formed in an area distant from the transistor active region. This provides electrical connection also for the gate electrode 6 to the substrate 1.

Figure 2:
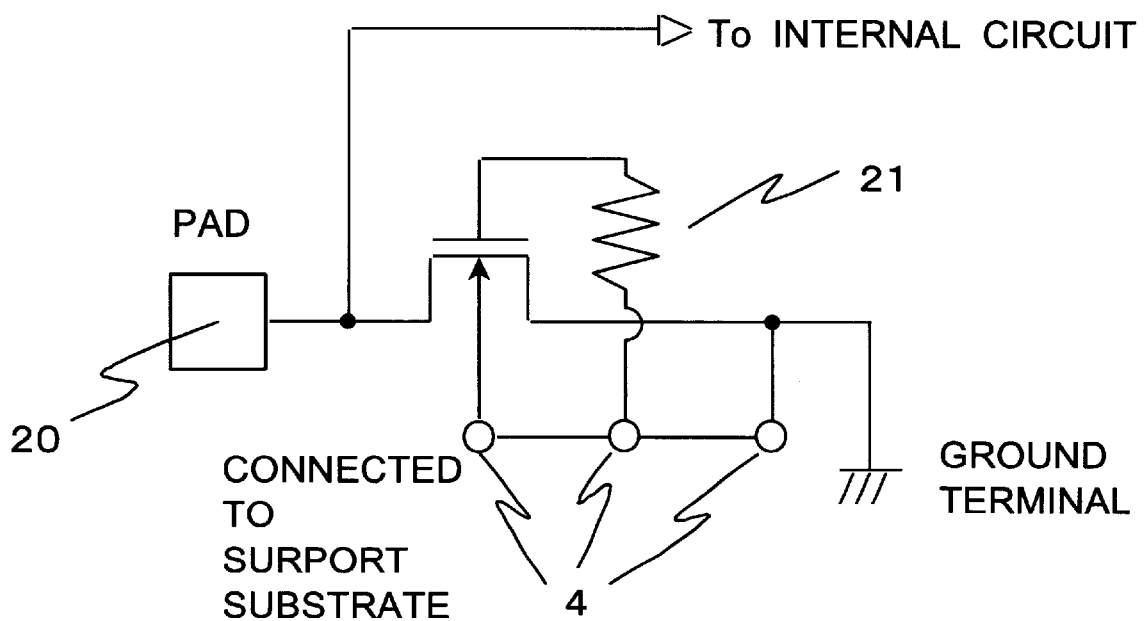
FIG. 2 is a connection diagram of a static electricity protection transistor of the invention.

Referring to FIG. 2, description will be made on the connections to various regions.

The static electricity protection transistor of the invention is connected to a pad 20 of an IC chip. The drain region 8 is connected to the pad 20 and to an internal circuit of the integrated circuit. The gate electrode 6 is connected to the substrate contact 4 through a resistance 21 formed of polysilicon having a diffusion region. The source region 7 is connected to the ground region 9 and to the substrate contact 4. The channel region 3 is connected to the substrate connection region contact 5 through the connection region 15 while the substrate connection region contact 5 is connected to the substrate contact 4 via the metal interconnection 16. This connection provides a same potential for the channel region 3, the gate electrode 6, the source region 7 and the ground region 9. It is herein desired that the substrate 1 is connected to a ground terminal of the internal circuit through the substrate contact 4. However, where the potential of the substrate 1 cannot be given a ground potential due to operation of the internal circuit, the source region 7 and the ground region 9 are connected not to the substrate 1 but to the ground terminal of the internal circuit. In such a case, circuital devising is required not to allow the static electricity charges flowing to the ground terminal to flow toward the transistors of the internal circuit.

The operation of the static electricity protection transistor of the invention will now be described.

The static electricity entered the pad 20 then comes to a drain region 7 of the static electricity protection transistor where surface breakdown occurs due to a voltage determined by the gate oxide film 14 the shape of the drain, etc. Thereupon, the charges flow through the channel region 3, connection region 15, substrate connection region contact 5 metal interconnection 16 and substrate contact 4 to the substrate 1. Then, the flow of charges toward the substrate causes voltage drop, increasing the potential of the channel region 3. Thereupon, bipolar operation is turned on through between the drain region 8, channel region 3 and source region 7 so that charges flow through the drain region 8 toward the source region 7. If bipolar operation is further induced through the drain region 8, the channel region 3 and the source region 7 to cause a large current to flow through the transistor, extremely great heat generation will occur in the transistor. However, because of the structure as stated above, the heat if generated in the channel region 3 upon flowing a current is released to the substrate 1 through the connection region 15, substrate connection region contact 5, metal interconnection 16 and substrate contact 4. This eliminates the problem of causing thermal breakdown due to heat remained in the channel region 3.

Here, if the source region 7 and ground region 9 are not connected to the substrate contact 4, the source region 7 and ground region 9 will be connected to a ground terminal of the internal circuit. This causes a great amount of charges to flow to the ground terminal due to bipolar operation, possibly breaking down the transistor of the internal circuit being connected to the ground terminal. To prevent this, the present embodiment has one feature that the connection of the source region 7 and ground region 9 to the substrate contact 4, thereby making it possible to release to the substrate 1 a great amount of charges caused due to bipolar operation. Thus, there is no fear that the transistor of the internal circuit be broken down.

Furthermore, the connection region 15, substrate contact 4 or substrate connection region contact 5 may be increased in specific resistance. This is because, when static electricity enters the pad 20 to cause surface breakdown on the static electricity protection transistor and thereby flow charges from the channel region 3 through the connection region 15 to the substrate 1, the high specific resistance of the connection region 15, substrate contact 4 and substrate connection region contact 5 increases a voltage drop to be caused upon flowing the charges to the substrate 1, thus promptly increasing the potential of the channel region 3. Thus, bipolar operation is positively induced between the drain region 8, the channel region 3 and the source region 7 to release the static electricity.

Figure 3:
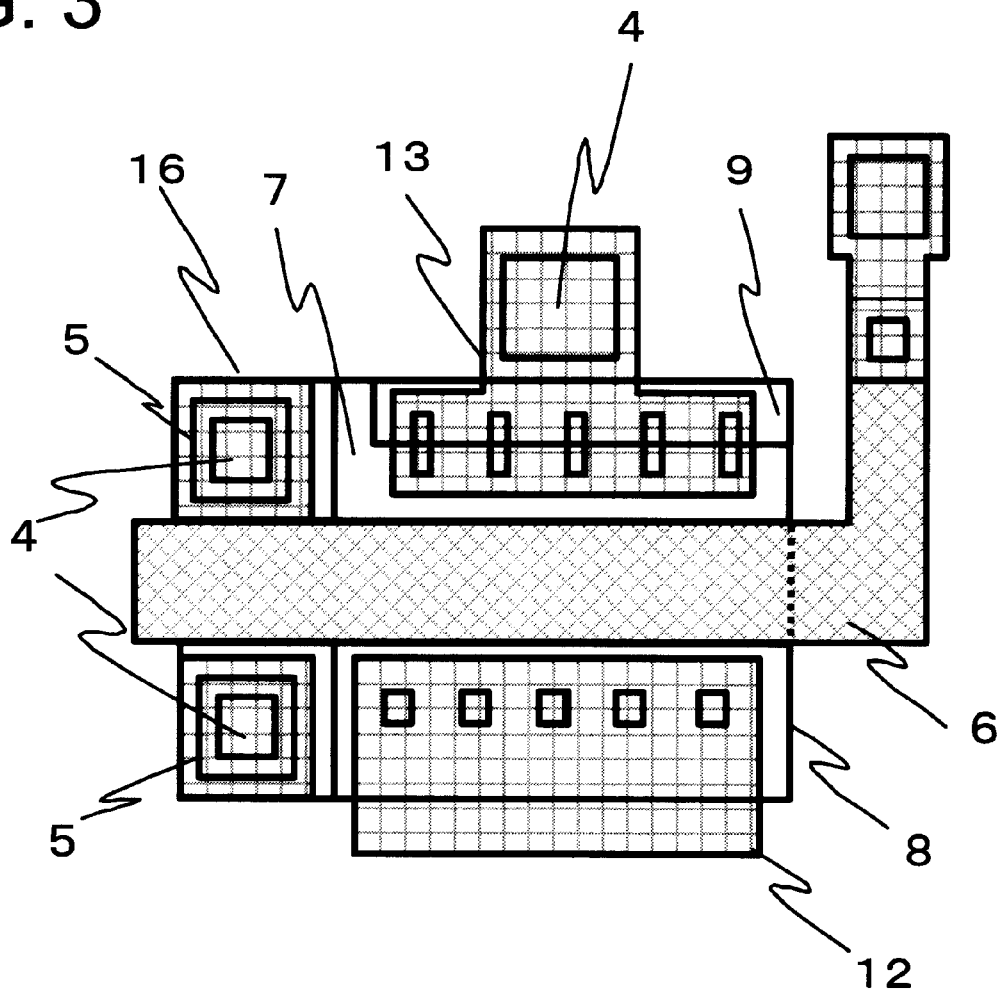
FIG. 3 is a view showing another embodiment of a static electricity protection transistor of the invention.

Referring to FIG. 3, there is illustrated a static electricity protection transistor according to another embodiment of the invention. The static electricity protection transistor of this embodiment is characterized by a location of arranging the substrate contact 4 and substrate connection region contact 5 to connection between the channel region 3 and the substrate 1. That is, as shown in FIG. 3 the substrate contact 4 and substrate connection region contact 5 for connection between the channel region and the substrate is arranged in a location adjacent to the source region 7 and drain region 8 and to the gate electrode 6. Ion implantation is made with a same P-conductivity as that of the substrate to an area around these substrate contact 4 and substrate connection region contact 5. This brings the potential of the channel region 3 to the same potential as the substrate 1, through the substrate connection region contact 5 and substrate contact 4. Here, a problem arises for a layout of the ground region 9. The region around the substrate contact 4 and substrate connection region contact 5 is in the same P-conductivity type as the substrate. Consequently, the layout of the source region 7 and ground region 9 as shown in FIG. 1 will result in a direct connection of the ground region 9 with the channel region 3. If, in such a state, static electricity enters the transistor to flow charges into the source region 7, the charges reversely flow through the ground region 9 to the channel region 3. This results in a fear of breaking down the gate oxide film 14. In order to avoid this, in the present embodiment the substrate contact 4 and the substrate connection region contact 5 are arranged in location adjacent to the source region 7 and drain region 8 and to the gate electrode 6. In this case, a layout is provided as shown in FIG., 3 wherein the ground region 9 is surrounded by the source region 7 and LOCOS 18 without bordering on the P-type region around the substrate contact 4 and substrate connection region contact 5. The arrangement of the substrate contact 4 and substrate connection region contact 5 adjacent to the source region 7, drain region 8 and gate electrode 6 provides a connection between the channel region 3 and the substrate 1 without having a connection region 15, result in space saving.

Furthermore, the ground region 9 may be surrounded by the source region 7 and LOCOS 18 to provide a layout that the ground region 9 does not border on the P-type region around the substrate contact 4 and substrate connection region contact 5. This eliminates the fear that the charges flown to the source region 7 reversely flow through the ground region 9 to the channel region 3 with a result of breaking down the gate oxide film 14.

Meanwhile, in the case that the static electricity protection transistor is formed on a bulk wafer, the gate electrode 6 in ground is connected to a substrate through a resistance. This is because, if the gate electrode 6 is directly connected to the ground terminal, the static electricity entered the ground terminal directly comes to the gate electrode 6 thereby breaking down the gate oxide film 14. If a static electricity protection transistor is formed on an SOI wafer with a small thickness of an SOI layer 19 into a same structure and layout as those on a bulk structure, the connection region of the gate electrode 6 to the substrate will have a periphery and bottom surface surrounded by an oxide film, thus being brought into a state of not connected to anywhere. This makes the potential on the gate electrode 6 unstable and hence surface breakdown as operation principle of the static electricity protection transistor difficult to occur. Due to this, bipolar operation capable of releasing a great amount of charges is not caused, thus resulting in internal circuit electrostatic breakdown. To prevent this, there is a method of connecting the gate electrode 6 to the ground terminal through a resistance 20 with high resistance value. However, there is a problem that the increase in resistance value requires to increase the length of the resistance 20, hence requiring increased area. Contrary to this, in the embodiment of the invention the gate electrode 6 is connected to the substrate 1 through the metal interconnection 17 and substrate contact 4 and further the substrate 1 is connected to the ground terminal through the metal interconnection and substrate contact 4 in the semiconductor integrated circuit. The gate electrode 6 has a potential fixed at a ground potential so that surface breakdown is easy to occur. Accordingly, there is no possibility that the static electricity entering through the ground terminal come to the gate electrode 6 to break down the gate electrode 14.

With reference to FIGS. 4–6, description will be made on a method for manufacturing a static electricity protection transistor according to the invention.

Figure 4A:
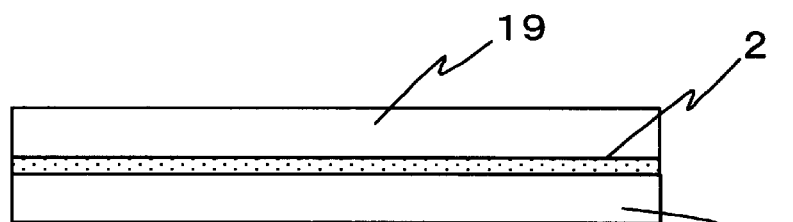
FIGS. 4A–4E are a process flow (1) showing a method for manufacturing a static electricity protection transistor of the invention.
Figure 4B:
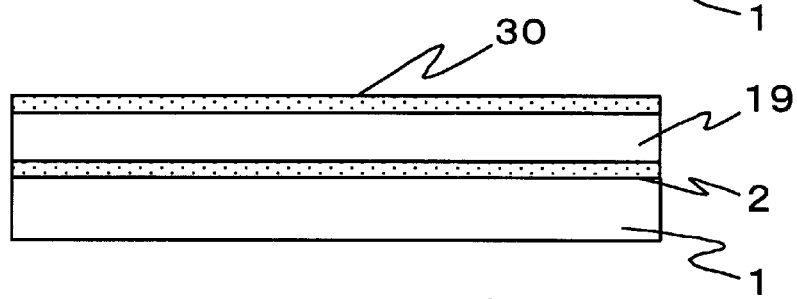
Figure 4C:
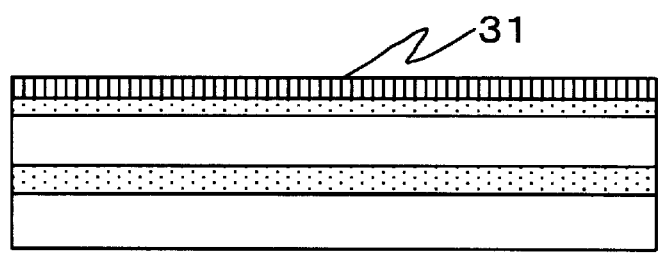
Figure 4D:
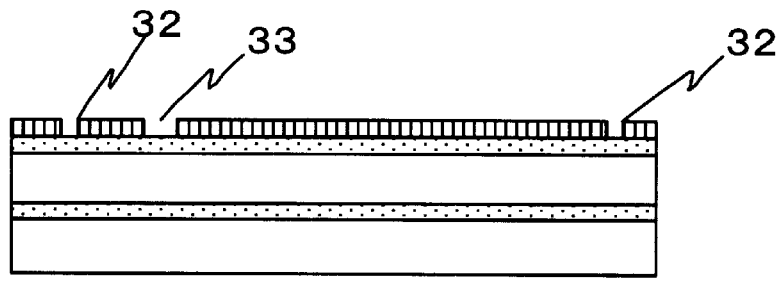
Figure 4E:
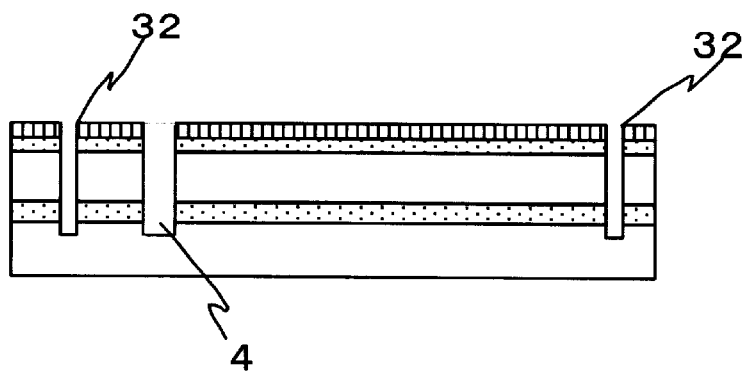

Referring to FIG. 4A, an SOI wafer has an SOI film 19 provided on a substrate 1 through an insulation film 2. On the SOI wafer, an oxide film 30 is formed to a thickness of approximately 100 angstroms (FIG. 4B). This oxide film 30 protects a surface of the SOI film 19, and also is required to reduce damage on the ion implantation to be suffered upon forming a well. Then, as shown in FIG. 4C resist 31 is applied over the oxide film 30. The resist 31 serves as an alignment mark as well as an etch mask for etching during forming a substrate contact. Next, exposure is conducted to form, as shown in FIG. 4D, an opening 33 for forming a substrate contact and an aliment mark 32. Next, as shown in FIG. 4E the resist 31 is used as a mask to conduct dry etching penetrating the oxide film 30, SOI film 19 and insulation film 2 and down to part of the substrate 1. There may be a case that the resist 31 cannot endure where the etch time is long. In such a case, a nitride film is formed on the oxide film 30 to perform etching through the nitride film as a mask. This process results in formation of an alignment mark on all the films (insulation film 2, SOI film 19) over the substrate 1. Conventionally, although the alignment mark 32 has been provided by a step due to forming an oxide film, it has been impossible on an SOI wafer with a thin SOI layer 19 to provide a step greater than a thickness of the SOI layer 19. Due to this, on an SOI wafer with an SOI layer 19 of approximately 500 angstroms, the alignment mark step will be as small as 500 angstroms or smaller, thus being difficult to be aligned. In the embodiment of the invention, therefore, an alignment mark is formed by conducting etching penetrating through the SOI layer 19, the insulation film 2 and part of the substrate 1. This makes alignment positive and eliminates a disadvantage that an alignment mark is lost during a film removal process. Furthermore, a contact hole to the substrate 1 is also formed during forming such an alignment mark, contributing to reduction in the number of processes.

Figure 5A:
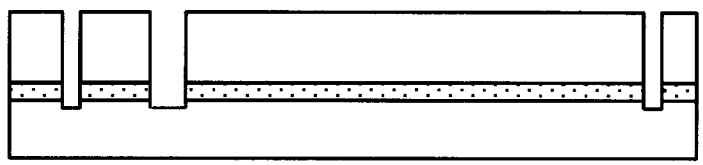
FIGS. 5A–5E are a process flow (2) showing the method for manufacturing a static electricity protection transistor of the invention.
Figure 5B:
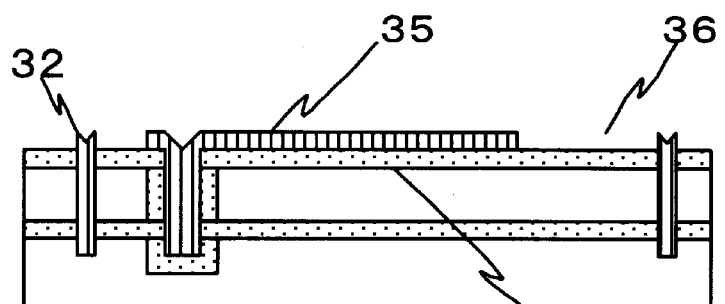
Figure 5C:
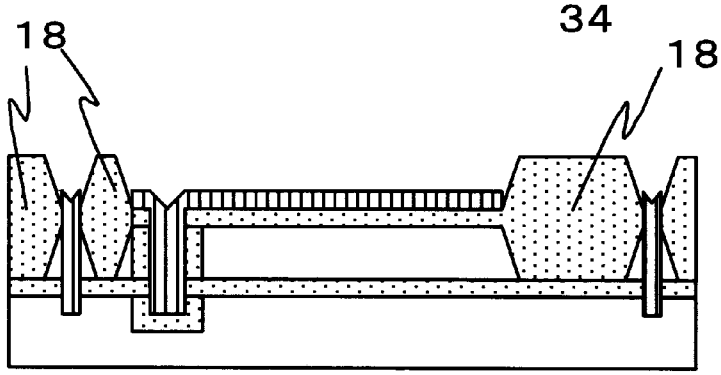

Then, as shown in FIG. 5A, the resist 31 and the oxide film 30 are removed (when a nitride film is used as a dry etch mask, the nitride film is removed by dry etching). Then, a process of forming LOCOS 18 is entered. That is, a thermal oxide film 34 is formed to approximately 160 angstroms on the SOI wafer, and further a nitride film 35 is formed to approximately 1600 angstroms thereon. Next, alignment and exposure are performed with reference to the alignment mark 32, and the nitride film 35 is etched to form an opening 36 for forming LOCOS (FIG. 5B). In this state, the wafer is placed in a thermal oxide furnace to form LOCOS 18 in the opening 36. LOCOS 18 is formed to a thickness reaching the insulation film 2 on the substrate 1. After forming the LOCOS 18, the nitride film 35 is removed and further the oxide film in other areas than the LOCOS 18 is all removed. Thereafter, a gate oxidation process is proceeded.

Here, the formation of the substrate contact 4 simultaneous with the formation of alignment mark 32 as in the present embodiment provides the following effect. Although wet etching with phosphoric acid is used to remove the nitride film 35, the phosphoric acid etches not only the nitride film but also silicon. Consequently, the substrate contact 4 and the alignment mark 32 must be covered by an oxide film. In the present embodiment, after forming the substrate contact 4 and alignment mark 32, a thermal oxidation process and then a nitride film forming process are proceeded. Accordingly, the substrate contact 4 and the alignment mark 32 are covered by an oxide film. Thus, there is no disadvantage that the substrate contact 4 and alignment mark 32 in lateral wall and bottom surface silicon are etched by wet etching with phosphoric acid.

Figure 5D:
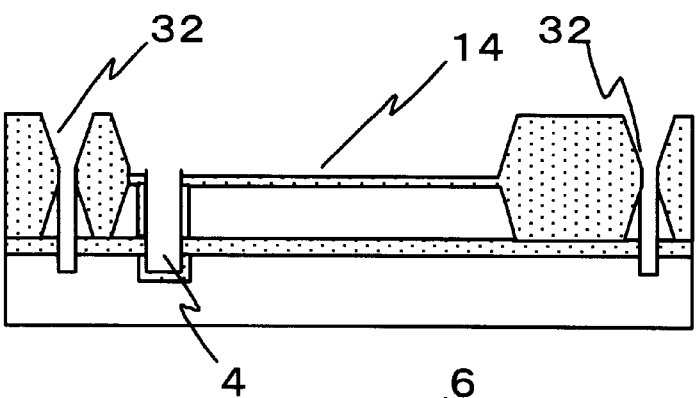

Next, as shown in FIG. 5D a gate oxide film 14 is formed in other areas than the LOCOS by thermal oxidation. Here, in an alignment process after the gate oxidation process, alignment is performed with reference to the alignment mark 32. That is, the alignment mark 32 has been formed by etching in a manner so as to penetrate through the SOI film 19 and insulation film 2 and reach part of the substrate 1. Due to this, a recess has been provided in part of the substrate 1.

Figure 5E:
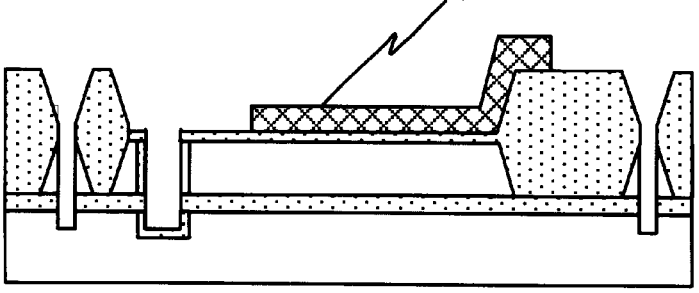
Figure 6A:
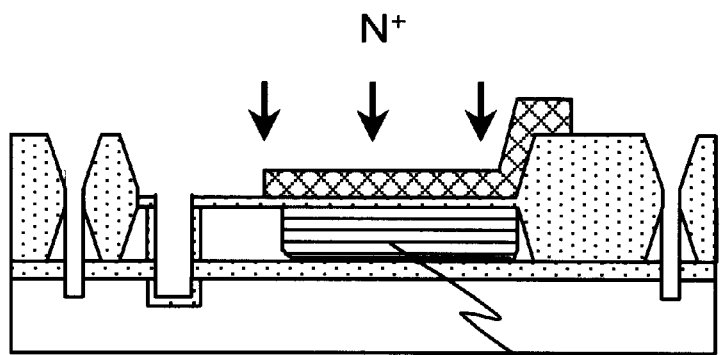
FIGS. 6A–6D are a process flow (3) showing the method for manufacturing a static electricity protection transistor of the invention.

Next, polysilicon is formed to 3000 angstroms on the gate oxide film 14, and alignment and exposure are performed with reference to the alignment mark 32 to dry-etch the polysilicon, forming a gate electrode 6 (FIG. 5E). Then, as shown in FIG. 6A, ion implantation is conducted to form a source region 7 and drain region 8 for a transistor. Because a static electricity protection transistor of this embodiment uses an N-type transistor, N-type ions are implanted.

Figure 6B:
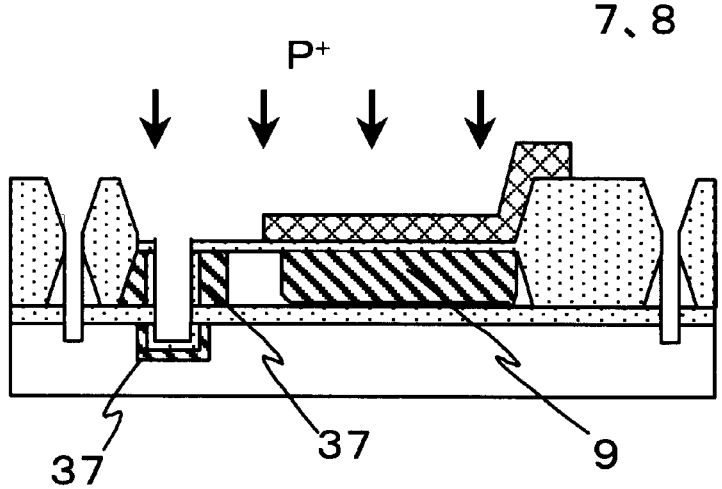

Next, as shown in FIG. 6B ion implanting is performed to form a ground region 9 and simultaneous to form a diffusion connection region (low resistance connection region) 37 for reducing contact resistance between the substrate contact 4 and substrate connection region contact 5 and the metal interconnections 12, 13, 16, 17. This ion implanting is made through patterning to implant ions to around and bottom surface of the substrate contact 4. Here, a P-type ion species is implanted because a static electricity protection transistor is an N-type transistor.

Figure 6C:
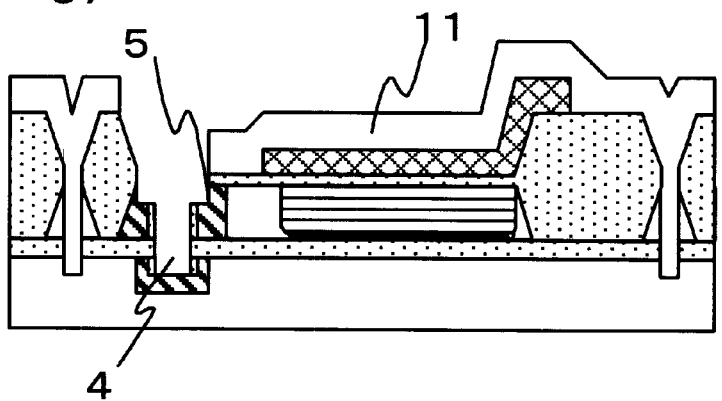

Then, an interlayer insulation film 11 is formed on the gate electrode 6. Thereafter, as shown in FIG. 6C a hole for substrate contact 4, substrate connection region contact 5 and interconnect contact 10 is formed by dry etching. Here, a relationship is important between the substrate contact 4 and the substrate connection region contact 5. The substrate contact 4 hole has a side surface covered by an oxide film because of conducting the gate oxidation process. Consequently, it is impossible to provide an electrical connection between the connection region 15 and the substrate 1 by burying metal in the substrate contact 4. Accordingly, a substrate connection region contact 5 is provided surrounding the substrate contact 4 and in a size greater than the substrate contact 4. Metal is buried in this substrate connection region contact 5 thereby providing electrical connection between the connection region 15 and the substrate 1.

Figure 6D:
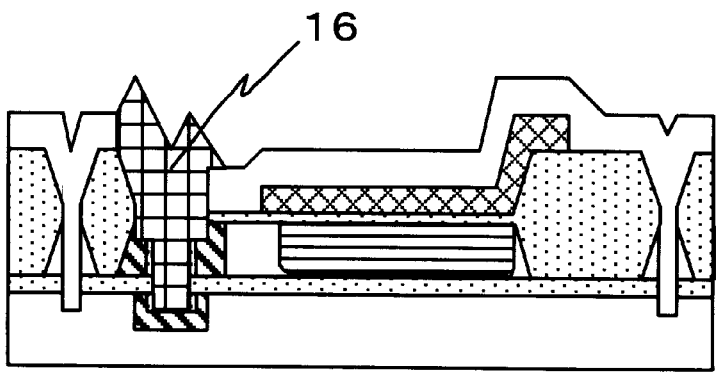
Figure 7A:
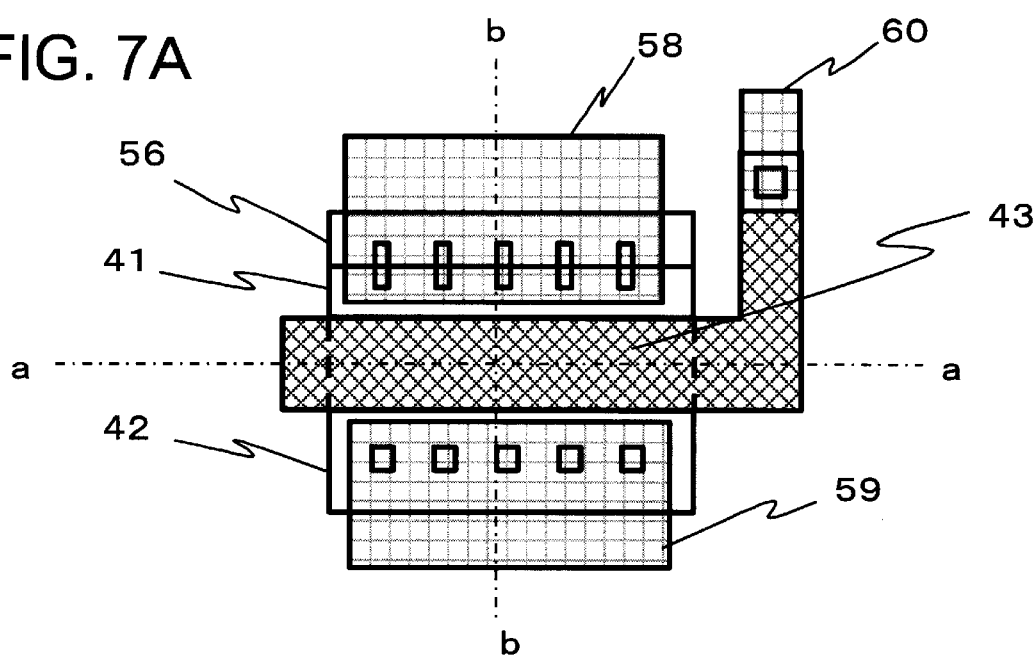
FIG. 7A is a plan view showing a structure of a conventional static electricity protection transistor.
Figure 7B:
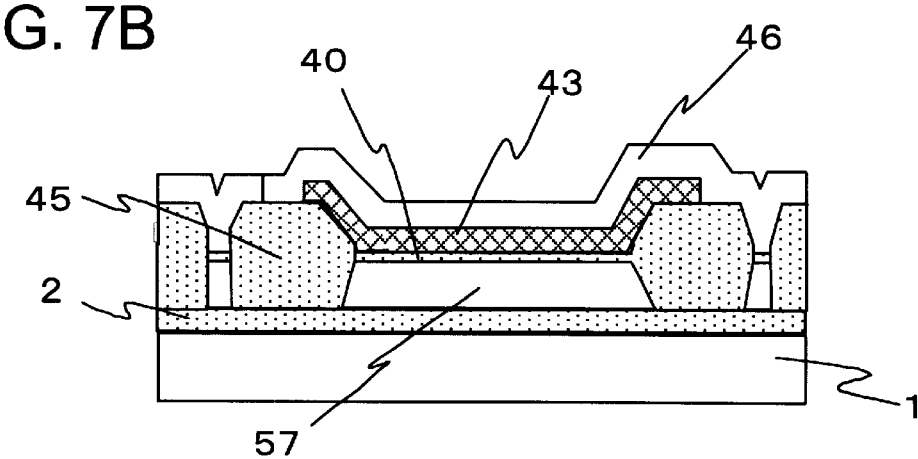
FIG. 7B is a sectional view showing a structure taken on line a—a in FIG. 7A.
Figure 7C:
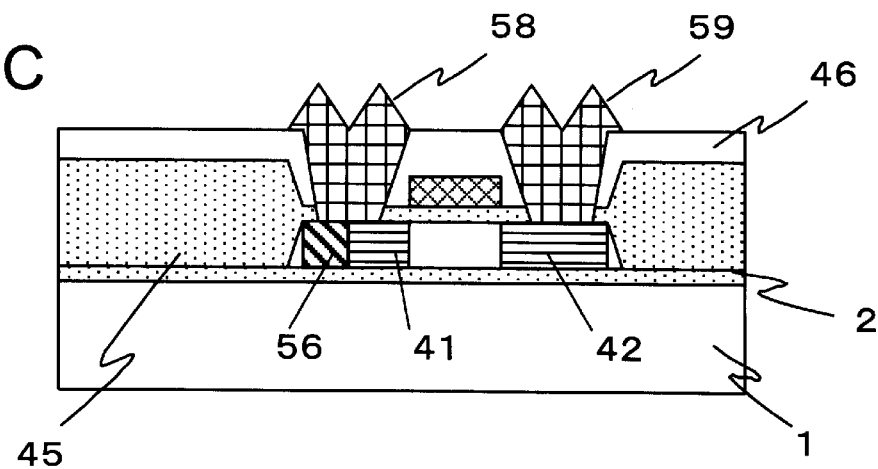
FIG. 7C is a sectional view showing a structure taken on line b—b in FIG. 7A.
Figure 8:
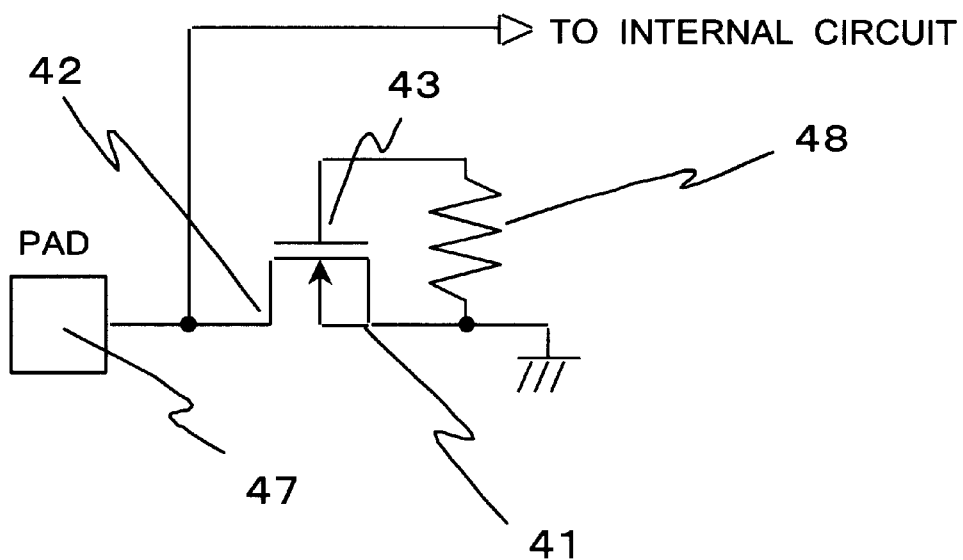
FIG. 8 is a connection diagram of the conventional static electricity protection transistor.
Figure 9A:
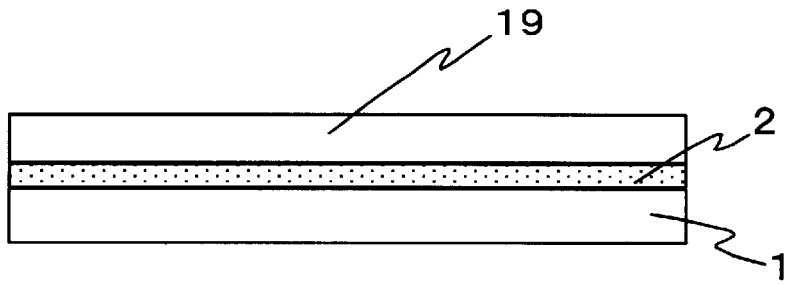
FIGS. 9A–9E are a process flow (1) showing a method for manufacturing a conventional static electricity protection transistor.
Figure 9B:
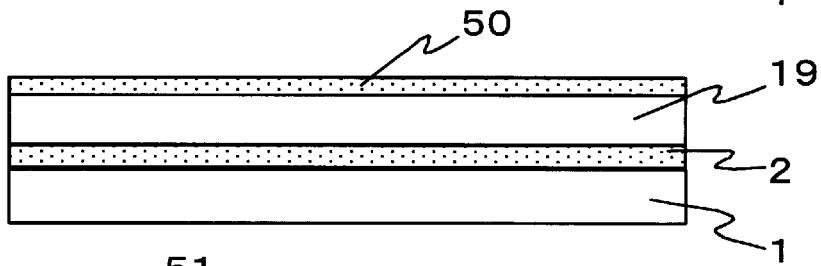
Figure 9C:
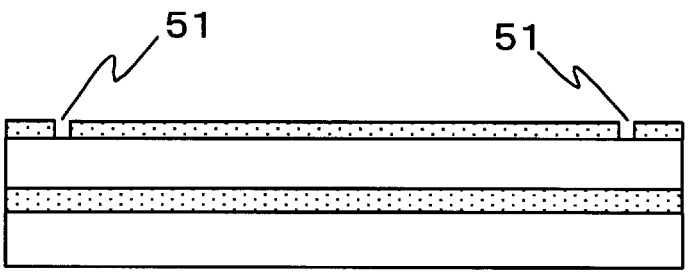
Figure 9D:
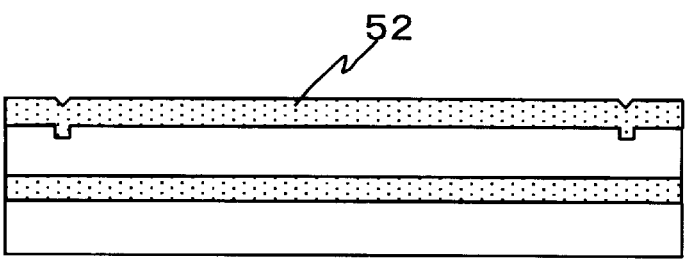
Figure 9E:
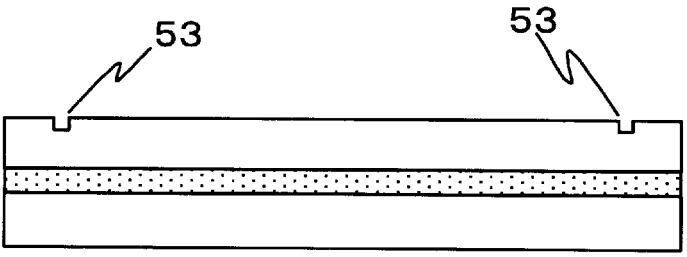
Figure 10A:
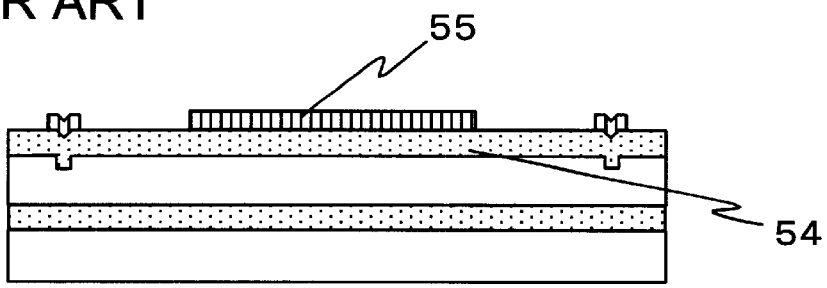
FIGS. 10A–10E are a process flow (2) showing the method for manufacturing a conventional static electricity protection transistor.
Figure 10B:
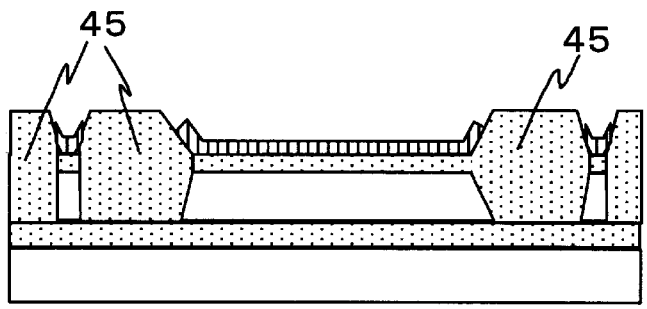
Figure 10C:
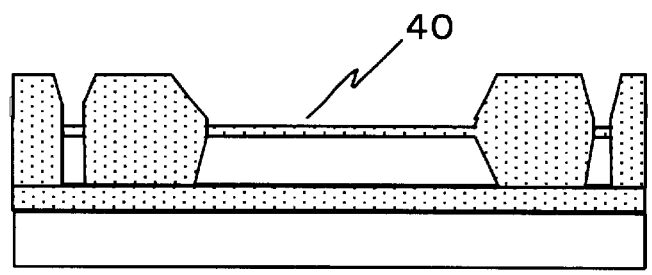
Figure 10D:
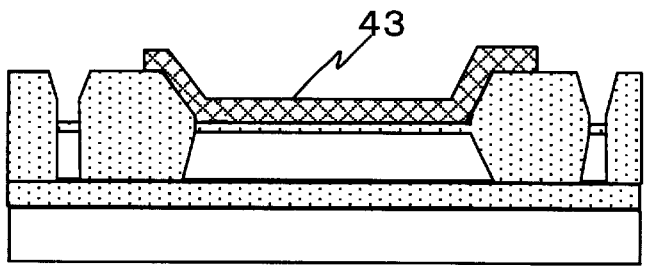
Figure 10E:
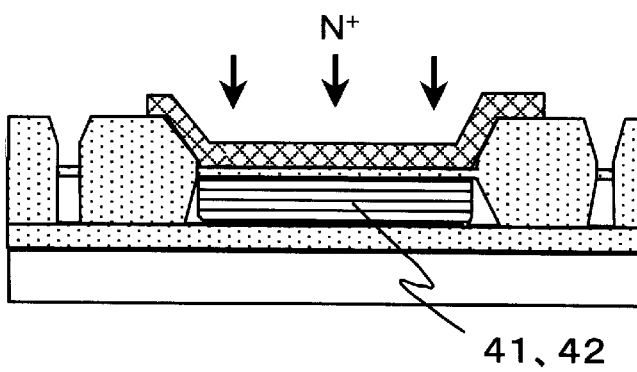
Figure 11A:
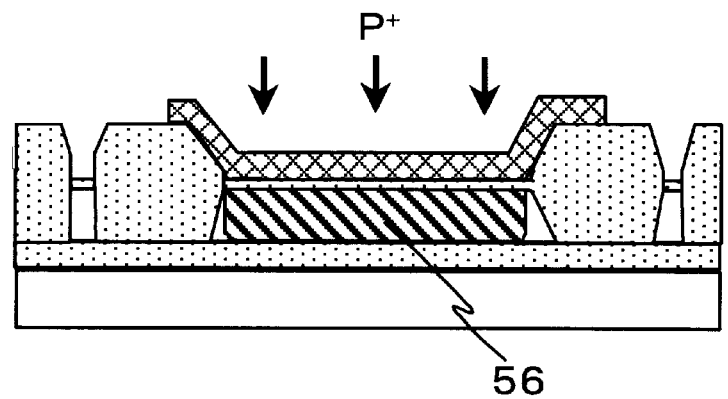
Figure 11B:
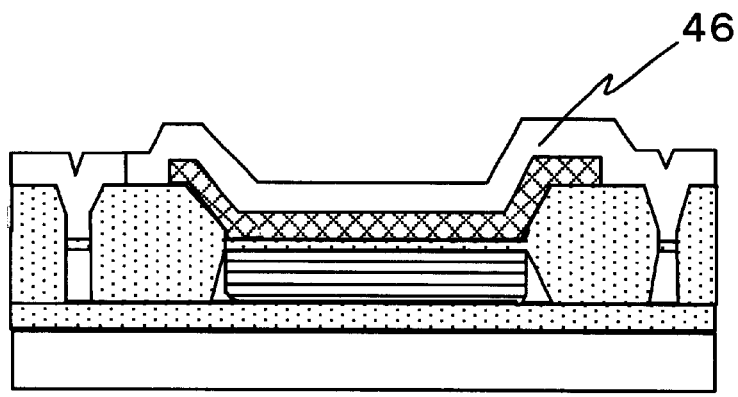
Figure 11C:
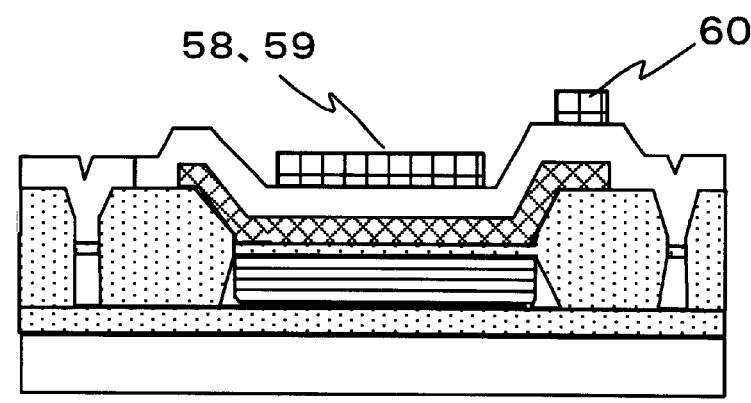

Then, reflow is conducted to planarize the interlayer insulation film 11. Thereafter, as shown in FIG. 6D metal is film-formed and patterned to form metal interconnections 12, 13, 16, 17 on the substrate contact 4, substrate connection region contact 5, interconnect contact 9 for source/drain/ground region, and gate electrode 6.

The structure and method as discussed above provide the following effects.

The static electricity protection transistor of the invention is formed on an SOI film over a substrate, and constituted by a gate electrode, source and drain regions and a substrate contact. The substrate contact is connected to the substrate through the SOI film and on-substrate insulation film. Furthermore, a substrate connection region contact connects between a channel region of the static electricity protection transistor and the substrate contact. With this structure, static electricity enters the pad and surface breakdown occurs in the static electricity protection transistor so that charges flow to the channel region of the static electricity protection transistor. However, this region is connected to the substrate to have an increased capacity to accept charges. Thus, there is an effect of releasing static electricity without reaching electrostatic breakdown or Joule thermal breakdown. Meanwhile, where bipolar operation is induced through between the drain region, the channel region and the source region to thereby flow a large current to through the transistor, an extremely large amount of heat is produced from the transistor. However, the above structure releases the heat produced in the channel region due to current flow onto the substrate through the connection region, substrate connection region contact, metal interconnection and substrate contact. Thus, a problem is eliminated that the heat stays on the channel region resulting in thermal breakdown.

Meanwhile, the invention has an arrangement that the substrate connection region contact surrounds the substrate contact and includes the substrate contact. This provides a one-step contact hole to a sectional structure of the substrate contact and substrate connection region contact, thereby providing positive electrical connection between the connection region and the substrate while contributing to space saving.

Also, the invention connects between the source region and substrate contact of the static electricity protection transistor. This induces bipolar operation through the drain region, channel region and source region to allow the charges entered the source region to be released onto the substrate through the substrate contact. Thus, there is no possibility that the charges flow into other transistors connected to the ground line to thereby induce electrostatic breakdown.

Furthermore, the invention connects between the gate electrode of static electricity protection transistor and the substrate contact. This brings the gate potential to a same as the substrate potential, which eliminates the problem that no surface breakdown occur due to gate potential instability. The static electricity entered the pad causes surface breakdown to thereby induce bipolar operation through the drain region, channel region and source region. Thus, the charges are allowed to be released to the source region.

Also, by increasing the specific resistance of the connection region and substrate contact, a voltage drop is easy to occur that is to be caused upon flowing charges into the substrate, raising the potential in the channel region. Bipolar operation is caused more positively through between the drain region, channel region and source region, thus providing an effect of releasing static electricity.

Also, in the static electricity protection transistor, the substrate contact connecting between the substrate and the channel region is arranged in a location adjacent to the source and drain regions and also to the gate electrode. This provides a contact to the substrate without the necessity to have a connection region extended from the channel region, contributing to space saving. Furthermore, the potential of channel region is easy to fix because of short distance between the channel region and the substrate contact.

Furthermore, the method for manufacturing a static electricity protection transistor of the invention comprises a step of forming an oxide film on an SOI film provided over a substrate through an insulation film, a step of etching penetrating through the oxide film, SOI film and on-substrate insulation film and down to part of the substrate, a step of forming a LOCOS, a step of forming a gate oxide film, a step of forming a gate electrode, a step of performing ion implant to form source, drain and connection regions and reducing resistance of substrate contact and substrate connection region contacts, a step of forming an interlayer insulation film, a step of forming substrate and substrate connection region contacts, and a step of forming a metal interconnection. This makes it possible to form a hole for a substrate contact during the process of forming an alignment mark on the SOI wafer substrate, reducing the number of processes. Although conventionally a step has been formed in oxidation and etching processes to provide an alignment mark, in the invention an alignment mark is formed during the process of forming a substrate contact thus suppressing increase of the number of processes. Furthermore, where an SOI film has a small film thickness provided over the substrate through a insulation film, it is impossible to utilize a number of oxide film forming processes and hence to perform an oxidation process for alignment mark formation or increase an oxide film thickness to increase an alignment mark step. In the manufacturing method of the invention, however, a recess is formed by etching to utilize as an alignment mark. It is therefore possible to solve the problem that an alignment mark cannot be formed and the problem that a mark cannot be confirmed because of small step in an alignment mark. Also, in the invention the process is proceeded, after forming a substrate contact and alignment mark, to thermal oxidation and nitride film formation. Consequently, the substrate contact and alignment mark are covered by an oxide film during a process of removing a nitride film. Thus, the disadvantage is eliminated that the substrate contact and alignment mark at side wall and bottom surface silicon are etched by wet etching with phosphoric acid.

What is claimed is:

1. A method for manufacturing a semiconductor integrated circuit, comprising the steps of:

forming an insulation film on a semiconductor substrate;

forming an SOI film on the insulation film;

forming an oxide film on the SOI film;

forming a contact hole penetrating through the oxide film, the SOI film and the insulation film and extending partially into the semiconductor substrate;

forming LOCOS oxide regions over the semiconductor substrate;

forming a gate oxide film on side and bottom surfaces of the contact hole and over regions of the semiconductor substrate except for the LOCOS oxide regions;

forming a gate electrode on the gate oxide film;

removing the gate oxide film from part of the side surface and part of the bottom surface of the contact hole; and forming a metal interconnection to electrically connect the SOI film with the semiconductor substrate.

2. A method for manufacturing a semiconductor integrated circuit, comprising the steps of:

forming an insulation film on a semiconductor substrate;

forming an SOI film on the insulation film;

forming an oxide film on the SOI film;

forming a contact hole penetrating through the oxide film, the SOI film and the insulation film and extending partially into the semiconductor substrate;

forming LOCOS oxide regions over the semiconductor substrate;

forming a gate oxide film on side and bottom surfaces of the contact hole and over regions of the semiconductor substrate except for the LOCOS oxide regions;

forming a gate electrode on the gate oxide film;

decreasing a resistance of the SOI film and a resistance of the semiconductor substrate in a portion around the contact hole to form a first low resistance connection region and a second low resistance connection region;

removing the gate oxide film from part of the side surface and part of the bottom surface of the contact hole to expose the first low resistance connection region and the second low resistance connection region; and electrically connecting the first low resistance connection region with the second low resistance connection region.

3. A method for manufacturing a semiconductor integrated circuit, comprising the steps of:

forming an insulation film on a semiconductor substrate;

forming an SOI film on the insulation film;

forming an oxide film on the SOI film;

forming a contact hole and an alignment hole penetrating through the oxide film, the SOI film and the insulation film and extending partially into a part of the semiconductor substrate;

forming a LOCOS oxide layer over the semiconductor substrate by an exposure operation using the alignment hole as a reference so that the LOCOS oxide layer reaches the insulation film;

forming a gate oxide film on side and bottom surfaces of the contact hole and over regions of the semiconductor substrate except for regions over which the LOCOS oxide layer is formed;

forming a gate electrode on the gate oxide film;

decreasing a resistance of the SOI film and a resistance of the semiconductor substrate in a portion around the contact hole and performing ion implantation to form a first low resistance connection region and a second low resistance connection region;

forming an interlayer insulation film on the gate electrode;

removing the gate oxide film from part of the side surface and part of the bottom surface of the contact hole to expose the first low resistance connection region and the second low resistance connection region; and forming a metal interconnection to electrically connect the first low resistance connection region with the second low resistance connection region.

4. A method according to claim 1; further comprising the step of forming a source region and a drain region in the SOI film to provide a channel region in the SOI film extending between the source region and the drain region; and wherein the step of forming the metal interconnection comprises forming the metal interconnection in the contact hole to electrically connect the channel region in the SOI film with the semiconductor substrate.

5. A method for manufacturing a semiconductor integrated circuit, comprising the steps of:

forming an insulation film on a surface of a semiconductor substrate;

forming an SOI film on the insulation film;

forming an oxide film on the SOI film;

forming a contact hole penetrating through the oxide film, the SOI film and the insulation film and extending partially into the surface of the semiconductor substrate;

forming LOCOS oxide regions over the semiconductor substrate;

forming a gate oxide film over regions of the semiconductor substrate except for the LOCOS oxide regions;

forming a gate electrode on the gate oxide film;

forming a source region and a drain region in the SOI film to provide a channel region in the SOI film disposed between the source region and the drain region; and forming a metal interconnection in the contact hole to electrically connect the channel region in the SOI film with the semiconductor substrate.

6. A method for manufacturing a semiconductor integrated circuit, comprising the steps of:

forming an SOI film on a semiconductor substrate;

forming an oxide film on the SOI film;

forming a contact hole penetrating through the oxide film and the SOI film and extending partially into the semiconductor substrate;

forming a gate oxide film over the SOI film;

forming a gate electrode on the gate oxide film;

forming an electrical contact in a region of the SOI film between the channel region and the contact hole; and forming a metal interconnection in the contact hole in contact with the electrical contact to electrically connect the channel region in the SOI film with the semiconductor substrate.

7. A method according to claim 6; further comprising the step of decreasing a resistance of the SOI film to form a low resistance connection region in the region of the SOI film containing the electrical contact.

8. A method according to claim 6; further comprising the step of decreasing a resistance of the semiconductor substrate to form a low resistance connection region in a region of the semiconductor substrate into which the contact hole extends.

* * * * *